United States Patent

Halle et al.

[11] Patent Number: 5,877,061
[45] Date of Patent: Mar. 2, 1999

[54] METHODS FOR ROUGHENING AND VOLUME EXPANSION OF TRENCH SIDEWALLS TO FORM HIGH CAPACITANCE TRENCH CELL FOR HIGH DENSITY DRAM APPLICATIONS

[75] Inventors: Scott D. Halle, Hopewell Junction; ChorngLii Hwang; K. Paul Muller, both of Wappingers Falls, all of N.Y.

[73] Assignee: International Business Machines Corporation, Armonk, N.Y.

[21] Appl. No.: 807,479

[22] Filed: Feb. 25, 1997

[51] Int. Cl.⁶ .................................................. H01L 21/20
[52] U.S. Cl. .......................... 438/386; 438/391; 438/243; 438/248; 438/665; 438/964
[58] Field of Search .................................... 438/386, 391, 438/243, 248, 665, 964

[56] References Cited

U.S. PATENT DOCUMENTS

| | | |
|---|---|---|
| 4,906,590 | 3/1990 | Kanetaki et al. . |
| 5,153,813 | 10/1992 | Oehrlein et al. . |
| 5,155,657 | 10/1992 | Oehrlein et al. . |
| 5,191,509 | 3/1993 | Wen ......................................... 438/386 |
| 5,240,871 | 8/1993 | Doan et al. . |
| 5,244,842 | 9/1993 | Cathey et al. . |
| 5,245,206 | 9/1993 | Chu et al. . |
| 5,266,514 | 11/1993 | Tuan et al. . |
| 5,384,152 | 1/1995 | Chu et al. . |
| 5,405,801 | 4/1995 | Han et al. ................................ 438/386 |
| 5,444,013 | 8/1995 | Akram et al. . |
| 5,447,878 | 9/1995 | Park et al. . |
| 5,449,630 | 9/1995 | Lur et al. . |
| 5,508,542 | 4/1996 | Geiss et al. . |
| 5,573,973 | 11/1996 | Sethi et al. ............................... 438/386 |
| 5,753,558 | 5/1998 | Akram et al. ............................ 438/386 |
| 5,759,262 | 6/1998 | Weimer et al. .......................... 438/665 |

*Primary Examiner*—Peter Toby Brown
*Assistant Examiner*—Toniae M. Thomas
*Attorney, Agent, or Firm*—Whitham, Curtis, Whitham; Daryl K. Neff, Esq.

[57] ABSTRACT

Trench cells with increased storage capacity are prepared with roughened sidewalls using a layer of grainy polysilicon or hemispherical grain polysilicon. The top collar region of the trench is protected with oxide while the lower portion of the trench coated with polysilicon or hemispherical grain polysilicon is etched isotropically. The trench structure created has roughened sidewalls for increased volume of storage.

14 Claims, 2 Drawing Sheets

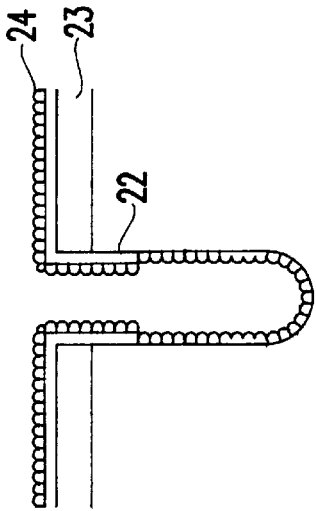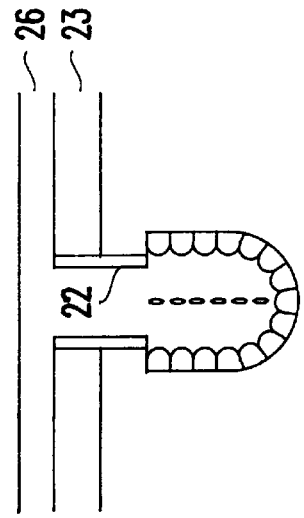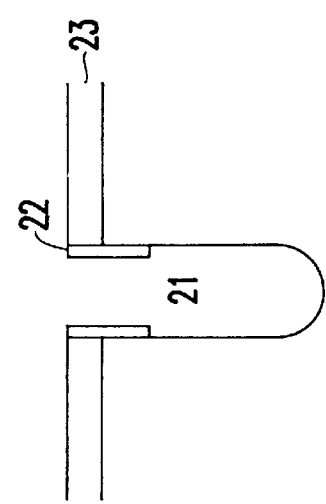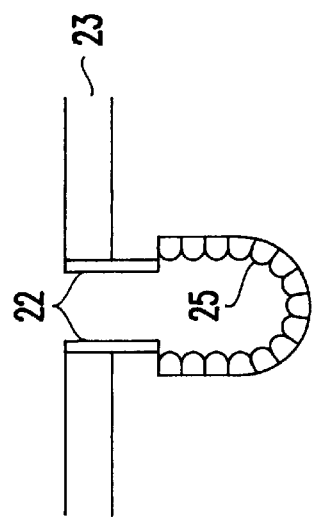

METHODS FOR ROUGHENING AND VOLUME EXPANSION OF TRENCH SIDEWALLS TO FORM HIGH CAPACITANCE TRENCH CELL FOR HIGH DENSITY DRAM APPLICATIONS

DESCRIPTION

1. Field of the Invention

The present invention generally relates to semiconductor manufacture and, more particularly, to methods of maintaining and increasing surface area in trenches as cell size decreases.

2. Background Description

Storage capacity often imposes a limitation on the miniaturization of integrated circuit (IC) chips for dynamic random access memories (DRAMs). Storage capacity is dependent on trench wall surface area. Many methods have been explored for increasing the storage capacity of IC chips. For example, horizontal trenches have been created in the sidewalls; porous layers on the trench surfaces have been used; sidewalls comprising multiple layers which are selectively etched to produce a roughened surface with increased surface area; and a surface layer in the trench can be doped with a crystal having a different structure than the material in the surface layer. Each of these methods increase production time and processing cost.

SUMMARY OF THE INVENTION

It is an object of the present invention to provide trench cells in wafers which have increased surface area in the sidewalls without increasing trench depth.

It is another object of this invention to increase storage capacity of trenches in integrated circuit (IC) chips without increasing production time or cost.

The methods of this invention form trench cells in semiconductor substrates with roughened sidewalls. These roughened sidewalls increase surface area for charge storage without increasing the trench opening area. This permits higher integration density of trench type capacitor structures. Since the capacitance is increased by these methods, the overall depth of the trenches can be decreased, effectively reducing the trench etching time and total processing cost. The methods of the invention are applicable to such applications as DRAM trench storage capacitors and all products with trenches as decoupling capacitors.

This invention utilizes the grainy structures of polysilicon combined with an isotropic etch to both controllably roughen trench sidewalls and expand the lateral width of the trench capacitors to provide high surface area for charge storage with no penalty on the trench opening area. Both polysilicon and hemispherical grain polysilicon may be used as roughening agents. Isotropic etch of the polysilicon will enhance the roughness and create larger surface area at the trench sidewall by preferentially etching the polysilicon grain boundary where dopants accumulate. Roughness may be controlled by initial grain size of polysilicon and the amount of isotropic etching.

BRIEF DESCRIPTION OF THE DRAWINGS

The foregoing and other objects, aspects and advantages will be better understood from the following detailed description of the preferred embodiments of the invention with reference to the drawings, in which:

FIG. 9 is a cross-sectional view of a trench having collar oxide prior to roughened sidewall formation, according to a second embodiment of the invention;

FIG. 10 is a cross-sectional view of the trench shown in FIG. 8 after deposition of rugged polysilicon;

FIG. 11 is a cross-sectional view of the trench shown in FIG. 9 following isotropic etch; and FIG. 12 is a cross-sectional view of the trench shown in FIG. 10 after deposition of thin node dielectric and polysilicon fill.

DETAILED DESCRIPTION OF THE PREFERRED EMBODIMENTS OF THE INVENTION

Figure 1:
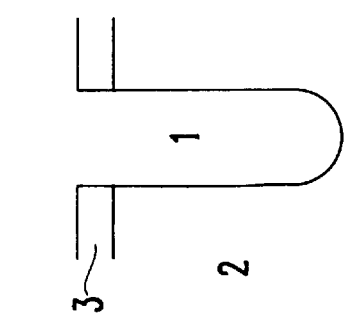
FIG. 1 is a cross-sectional view of trench prior to roughened sidewall formation, according to a first embodiment of the invention.

Referring now to the drawings, and more particularly to FIGS. 1 to 8, there is shown, in cross-sectional views, a trench as it is formed according to a first embodiment of the present invention. In FIG. 1, the trench 1 is shown as formed in the substrate. As shown, the trench 1 is formed in a substrate 2, such as silicon, using dielectric masking material 3.

Figure 2:
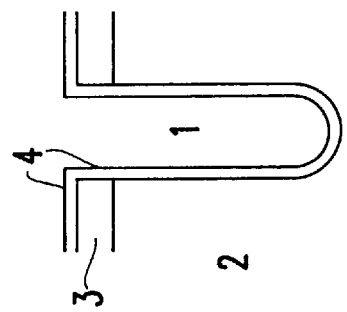
FIG. 2 is a cross-sectional view of the same trench as in FIG. 1 after the first processing step.

The same trench 1 is shown in FIG. 2 with a thin layer 4 of either amorphous silicon or polysilicon deposited over dielectric masking material 3 and on sidewalls of trench 1. This layer of amorphous silicon or polysilicon should be less than 100 nm in thickness and is preferably less than 50 nm. Amorphous silicon processes or low-temperature (<550° C.) polysilicon processes are preferred to enhance the conformality of the thin silicon layer 4. The thickness, deposition temperature and later thermal processes may be tuned to optimize the polysilicon grain size which will affect the final roughness of the trench sidewall.

Figure 3:
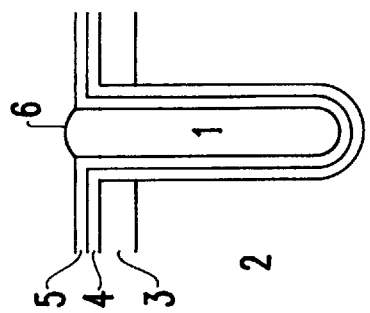
FIG. 3 is a cross-sectional view of the same trench as in FIG. 1 after deposition or coating of resist or polymer material.
Figure 4:
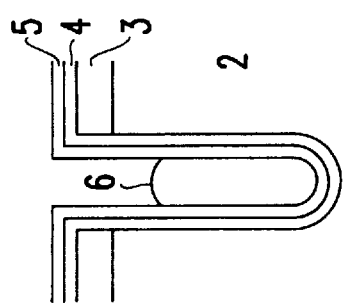
FIG. 4 is a cross-sectional view of the same trench as in FIG. 1, after polymer material has been recess etched.
Figure 5:
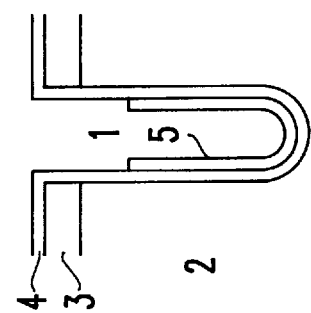
FIG. 5 is a cross-sectional view of the same trench as in FIG. 1 following resist strip.

A collar oxide is formed next. The subsequence for forming of thermal collar oxide is similar to the method described in U.S. patent application Ser. No. 08/610,912 "Storage Node Process for Deep Trench-Based DRAM" to H. Ho et al. with some modification. This application is hereby incorporated by reference. First, a thin layer of silicon nitride 5 is deposited. This layer may have a thickness of 20–200 Å, and preferably the thickness is 50–70 Å. Then, as shown in FIG. 3, the trench 1 is filled with resist or polymer material 6 and recessed etched. The trench following recess etching is shown in FIG. 4. After the recess etch, the remaining resist or polymer material 6 will protect that portion of the thin silicon nitride 5 which is covered by the remaining resist or polymer from being etched in the next step. Exposed silicon nitride 5 is then isotropically etched. Then, the resist or polymer material 6 is stripped by wet or dry chemistry. Following nitride etch and resist strip, a thin layer of silicon nitride 5 remains lining the trench 1, as shown in FIG. 5.

Figure 6:
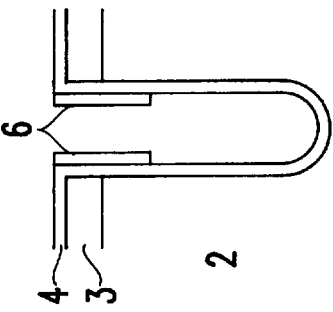
FIG. 6 is a cross-sectional view of the same trench as in FIG. 1 with collar oxide in place.

Thermal oxidation is used to form the trench collar 6. Finally, the oxidized nitride is stripped with isotropic etching. FIG. 6 shows the trench cross-section after collar oxide 6 formation and oxidized silicon nitride 5 strip.

After forming the collar oxide 6, isotropic silicon etch is performed to enhance the roughness of the polysilicon is performed. The selectivity of the silicon etch to oxide is important in order to preserve the integrity of the collar oxide 6. Highly isotropic etching is desired since it is trench sidewall that is to be etched. A variety of etching techniques and etchants could be used including chemical downstream etching (CDE) and wet etch in KOH. During this etch process the amorphous silicon or polysilicon layer 4 below the collar 6 may be etched through the trench sidewalls into the silicon substrate 2.

Figure 7:
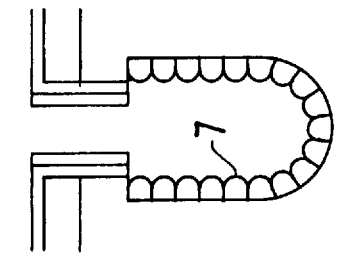
FIG. 7 is a cross-sectional view of the same trench as in FIG. 1 following an isotropic etch.

The result of the etching is shown in FIG. 7, where the sidewalls and base of trench 1 beneath the collar oxide 6 have a rough layer 7. The trench sidewall is roughened due to the grainy structure of the polysilicon and preferential etching of the grain boundary. Isotropic etching may also be used to control roughness. Since the etch rate varies with the grain size of the polysilicon, dictating the distributions of the polysilicon grain sizes will allow the control of the roughness of the surface and hence the capacitance. The polysilicon grain sizes, in turn, may be controlled by the thickness of the polysilicon/amorphous silicon deposited, and the thermal processes before the isotropic etch.

Figure 8:
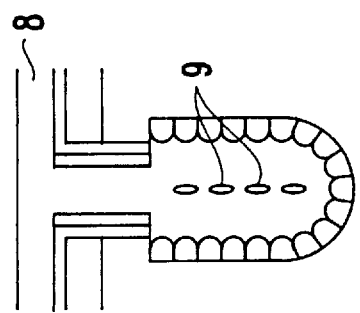
FIG. 8 is a cross-sectional view of the same trench as in FIG. 1 completed with node dielectric deposition and polysilicon fill.

Finally, node dielectric is deposited and the trench is filled with polysilicon 8, as shown in FIG. 8. The polysilicon may have some voids 9 in the bottom of the trenches. Unless in the collar region, voids are not a concern.

The second embodiment of the inventive method is shown in FIGS. 9 through 12. The principles and feasibility of roughening are the similar to those of the first method. The process sequence is altered as follows. Thermal collar oxide 22 is formed as described in the first method, but without the deposition of polysilicon. This is shown in FIG. 9 where a cross-section of a trench 21 has formed therein a collar oxide 22. Dielectric mask material 23 remains on the surface of the substrate (i.e., wafer, chip, etc.). Then, as shown in FIG. 10, polysilicon or hemispherical grain (HSG) polysilicon 24 is deposited. Next, the structure is isotropically etched by dry etch (CDE) or wet etch selective to oxide and nitride. As can be seen in FIG. 11, the polysilicon or HSG polysilicon 24 is removed from the collar oxide 22 and dielectric mask material 23. In addition, the polysilicon or HSG polysilicon 24 may be etched through the trench sidewalls. Following the etch, a rough surface 25 remains in the trench 21 below the collar oxide 22. Finally, as can be seen in FIG. 12, node dielectric is deposited and the trench is filled with polysilicon 26.

It is important to form the thermal collar before depositing polysilicon or HSG polysilicon to preserve a good collar oxide because there is no thermal process between polysilicon deposition and isotropic etching. Thermal annealing may be used to control the grain structure of the polysilicon.

While the invention has been described in terms of its preferred embodiments, those skilled in the art will recognize that the invention can be practiced with modification within the spirit and scope of the appended claims.

We claim:

1. A method of preparing a trench having a roughened surface area comprising the steps of:

forming a trench in a substrate through an opening in a dielectric mask material positioned on the substrate;

depositing a conformal layer of silicon containing material over said dielectric etch mask material and into said trench;

forming a collar oxide in an upper portion of said trench over said conformal layer of silicon containing material, said collar oxide leaving a lower portion of said trench exposed; and isotropically etching said silicon containing material and said substrate under said silicon containing material in said lower portion of said trench.

2. A method as in claim 1, further comprising depositing node dielectric and polysilicon fill in said trench.

3. A method as in claim 1, wherein said conformal layer of silicon containing material is amorphous silicon.

4. A method as in claim 1, wherein said conformal layer of silicon containing material is less than 100 nm thick.

5. A method as in claim 1 wherein said conformal layer of silicon containing material is polysilicon.

6. The method of claim 1 wherein said substrate is crystalline silicon.

7. A method of preparing a trench having a roughened surface area comprising the steps of:

forming a trench in a substrate through an opening in a dielectric mask material positioned on the substrate;

forming a collar oxide in an upper portion of the trench, said collar oxide leaving a lower portion of said trench exposed;

depositing a conformal layer of silicon over the dielectric mask material and in the trench; and etching said conformal layer of silicon.

8. A method as in claim 7 further comprising the steps of:

depositing a node dielectric; and filling the trench with polysilicon.

9. A method as in claim 7 wherein said conformal layer of silicon is hemispherical grain polysilicon.

10. A method as in claim 7 wherein said conformal layer of silicon is polysilicon.

11. A method as in claim 7 wherein said step of etching is performed by isotropically dry etching.

12. A method as in claim 11 wherein said step of dry etching is chemical downstream etching.

13. The method of claim 7 wherein said substrate is crystalline silicon and wherein said step of etching etches said substrate under said conformal layer of silicon.

14. A method as in claim 7 wherein said step of etching is performed by isotropically wet etching.

* * * * *